FREQUENCY SYNTHESIZER FOR REMOTELY CONTROLLABLE TRANSMITTER

Filed Aug. 27, 1963

4 Sheets-Sheet 1

Sept. 5, 1967 D. LEYPOLD 3,340,474

FREQUENCY SYNTHESIZER FOR REMOTELY CONTROLLABLE TRANSMITTER

Filed Aug. 27, 1963 4 Sheets-Sheet 2

Sept. 5, 1967 D. LEYPOLD 3,340,474

FREQUENCY SYNTHESIZER FOR REMOTELY CONTROLLABLE TRANSMITTER

Filed Aug. 27, 1963 4 Sheets-Sheet 3

Sept. 5, 1967 D. LEYPOLD 3,340,474

FREQUENCY SYNTHESIZER FOR REMOTELY CONTROLLABLE TRANSMITTER

Filed Aug. 27, 1963 4 Sheets-Sheet 4

United States Patent Office 3,340,474
Patented Sept. 5, 1967

3,340,474

FREQUENCY SYNTHESIZER FOR REMOTELY CONTROLLABLE TRANSMITTER

Dieter Leypold, Munich-Solln, Germany, assignor to Siemens & Halske Aktiengesellschaft, Berlin and Munich, Germany, a corporation of Germany Filed Aug. 27, 1963, Ser. No. 304,765
Claims priority, application Germany, Aug. 31, 1962, S 81,216
6 Claims. (Cl. 325—183)

Figure 1:
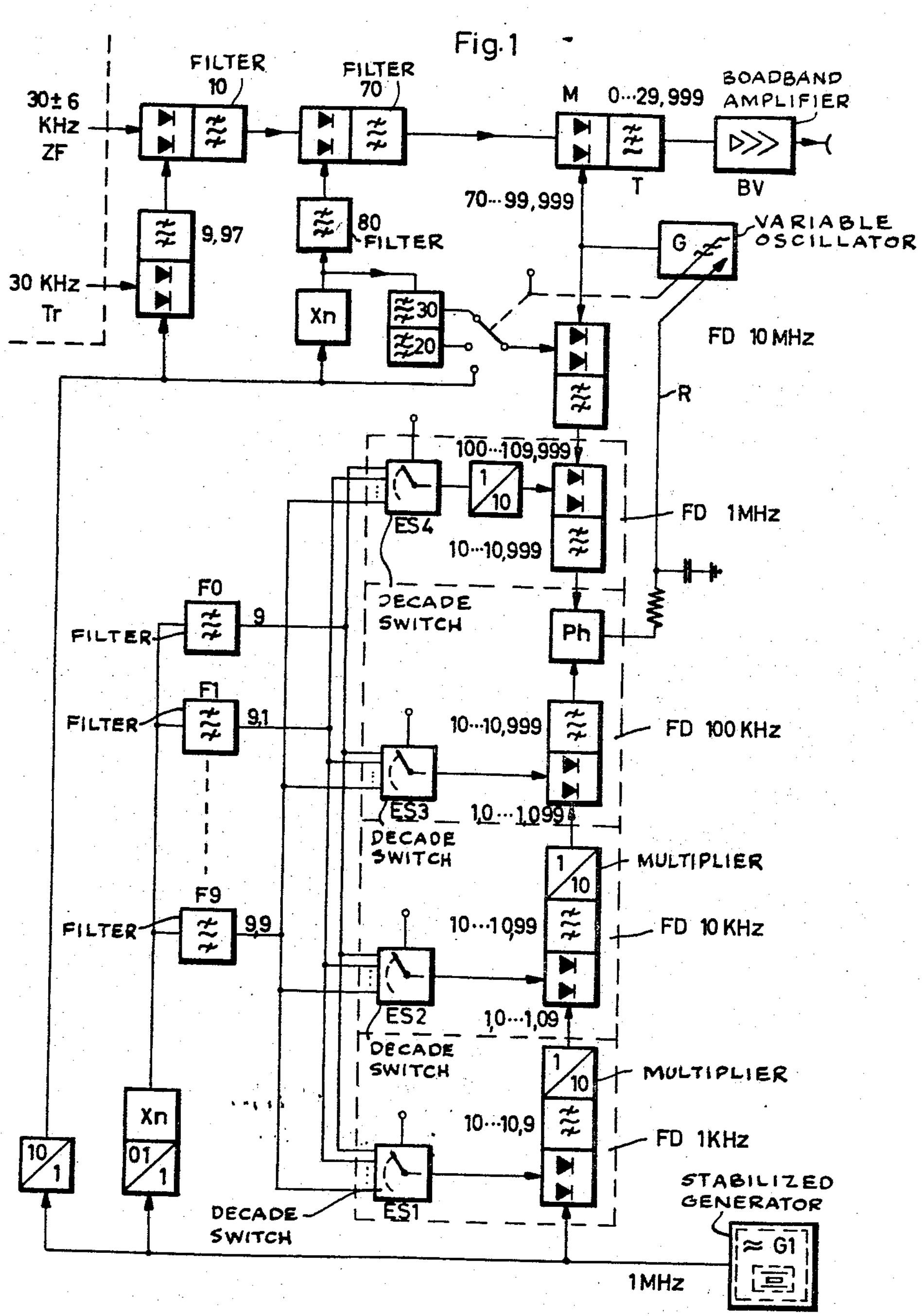

The present invention relates to remote-controlled transmitters, whose transmission-frequency oscillator can be adjusted by the use of frequency decades.

The manner of operation of such control circuits is based on the known fundamental thought of producing from a single standard frequency by multi-step division, multiplication and mixing with the filtering-out of a side band, any desired output frequency with a precision which depends on the standard frequency which is obtained from a quartz oscillator. Since with such an arrangement a plurality of undesired secondary frequencies is produced within these stages in addition to the desired frequencies, the output frequency thus obtained could be used for control of the transmitter only if the filtering in the set is very extensive. Therefore, the final product of the different transformation is used merely as comparison frequency for a free-running oscillator in order to produce the output frequency. By a synchronizing circuit, the output frequency of the oscillator is kept in agreement with the comparison frequency. This agreement can be produced by correcting the oscillator frequency by a controlled voltage which is obtained from the difference in phase between the oscillator voltage and the voltage of the comparison frequency.

The production of the comparison-frequency voltage takes place stepwise or stagewise in frequency decades, that is, in steps or stages for 100 kc., 10 kc. and 1 kc. The size of the adjustable frequency steps depends on the number of frequency decades employed. It is already known to form from a quartz stabilized oscillation by means of a ten-part harmonics cut-out filter, a frequency spectrum of 10 individually filtered harmonics, with a 100 kc. spacing, which can be supplied to each frequency decade via a separate switch. The decade stages consist of a mixer stage, a tunable single sideband filter and a 10:1 frequency divider. The comparison frequency is produced in the manner that the mixer stage of the smallest frequency decade, for instance the 100 cycle decade is fed, via the adjustable decade switch, the input frequency derived from the frequency-stabilized oscillation and one of the harmonics which has been filtered out. One of the sidebands formed in the mixer stage is filtered out and the single sideband which can be tuned in synchronism with the decade switch, is fed via the frequency divider to the next following frequency decade. The comparison frequency formed in this manner is finally compared, in a phase meter, with the frequency of the fixed-frequency oscillator which gives off the output frequency. The re-adjustment voltage obtained serves for the fixed-frequency adjustment of the oscillator which previously was set mechanically, for instance by a motor, to a point close to the desired frequency.

The tunable filter and decade switches used in all frequency decades in this known circuit and the tuning by motor of the oscillator for the output frequency result in a large number of mechanical moving parts which stand in the way of electronic remote control of the transmitter.

This disadvantage is eliminated in accordance with the present invention with a simultaneous reduction of the expense for the controllable transmitter in the manner that in combination with the use of a frequency plan for the frequency build-up of each frequency decade, in connection with which as a function of the quartz-stabilized input frequency and of the frequency position of the 100 kc. frequency spectrum for the mixing, there is obtained a frequency variation at the output of the modulator of each frequency decade stage which does not exceed 10 percent of the transformed frequency, filters of fixed-tuning and frequency-controlled frequency dividers without tuning are used in the frequency decades.

Two frequency plans which are particularly advantageous for the frequency build-up are based on a quart-stabilized input frequency of 1 megacycle and a frequency spectrum derived therefrom of a 100 kc. harmonics in the frequency range of 8.1 to 9 megacycles or 9 to 9.9 megacycles.

In accordance with one advantageous further development of the inventive concept, the variable oscillator with which an intermediate frequency is converted to the output frequency of the transmitter is designed for a frequency range lying above this variable output frequency. The signal which is thus obtained in the radio-frequency position can be fed directly via a low-pass filter to a wide-band amplifier. The synchronizing of the adjustable oscillator is effected by electronic frequency adjustment.

One embodiment of remote-controlled transmitter in accordance with the invention will be explained in further detail with reference to FIGS. 1 to 4.

In FIG. 1 there is shown in block diagram the basic structure of a remote-controlled transmitter. The variable oscillator G supplies the frequency controlled output frequency by which in the mixer stage M a signal-modulated high-frequency oscillation is transformed into transmitting frequency level which is adjustable for instance between 0 and 30 megacycles. The frequency adjustment of the oscillator G is effected by a comparison frequency produced by the frequency synthesis method. This comparison frequency is built up in several frequency decades starting from a frequency-stabilized input oscillation. In the quartz generator G1, a frequency-stabilized oscillation of for instance 1 megacycle is produced. From this fundamental oscillation a frequency spectrum of harmonics is formed by 10:1 frequency division and waveform distortion of the 100 kc. oscillations. In the cutout filters F0 to F9 ten adjacent harmonics of for example 9 to 9.9 megacycles are individually filtered out. Each individual harmonic can be offered separately via a separate decade switch ES1 to ES4 for the frequency build-up in the frequency decades, for instance FD 1 kc., FD 10 kc., FD 100 kc., and FD 1 megacycle. The frequency decades consist of a decade switch, a mixer stage (ring modulator), a fixed-tuned single sideband filter and—with the exception of the 100 kc. decade—a 10:1 frequency divider. In order to be able to tune a transmitter in the smallest possible steps, the use of additional decade steps is possible.

In the smallest frequency decade of 1 kc. shown in FIG. 1, the mixer stage is fed the oscillation of the quartz generator G1 and one of the 100 kc. harmonics between 9 and 9.9 megacycles. The frequency obtained by filtering and frequency-division is sent to the mixer stage of the next higher decade. Via the frequency division 10 kc. steps are obtained from the 100 kc. steps. This process is repeated up to the 100 kc. decade, from which there is taken the comparison voltage of 10 to 10.999 megacycles for the phase discriminator *Ph*. For the phase comparison there must be available at the second input of the phase discriminator a voltage of the same frequency obtained from the adjustable oscillator G after one or more transformations under the principle of frequency analysis. The oscillator G, the variable oscillation frequency of which is for instance within the range of 70 to 99.999 megacycles, can be electronically-switched into several frequency ranges and controlled in fixed-frequency manner within each range by the frequency control circuit. The switching of the oscillator in for instance three individual frequency ranges or the use of a plurality of individual oscillators which can each be electronically-connected individually to one partial frequency range, serves to facilitate the frequency readjustment. By mixing the oscillator voltage with a voltage of 10, 20 or 30 megacycles obtained from the quartz generator by frequency multiplication, the oscillator voltage is each of the switchable ranges between 70 to 99.999 megacycles is transformed to a frequency of between 100 and 109.999 megacycles. In a further mixing stage of the frequency decade of 1 megacycle, the oscillator oscillation is transposed to a frequency position which corresponds to the comparison frequency F4″.

The fundamental differences between the circuit described and the arrangement already known in principle are that instead of the complicated tunable filters of fixed tuning are used and that all mechanically-moved parts which were necessary for the tuning of the filters in combination with the decade switches as well as the motor actuated readjusting devices are eliminated. Further essential advantages result from this. The sets can be considerably simplified mechanically and electrically and can be equipped for purely electronic remote control which makes possible a particularly rapid change in frequency. The setting up of a frequency program for the frequency build-up is of decisive importance in this connection.

A prerequisite for the use of fixed-tuned filters is that the frequency changes occurring in the frequency decades must not be greater than 10 percent.

This condition is fulfilled when the frequency build-up in the frequency decades is effected in the frequency level 10+1 megacycle or 10−1 megacycle.

Figure 2:
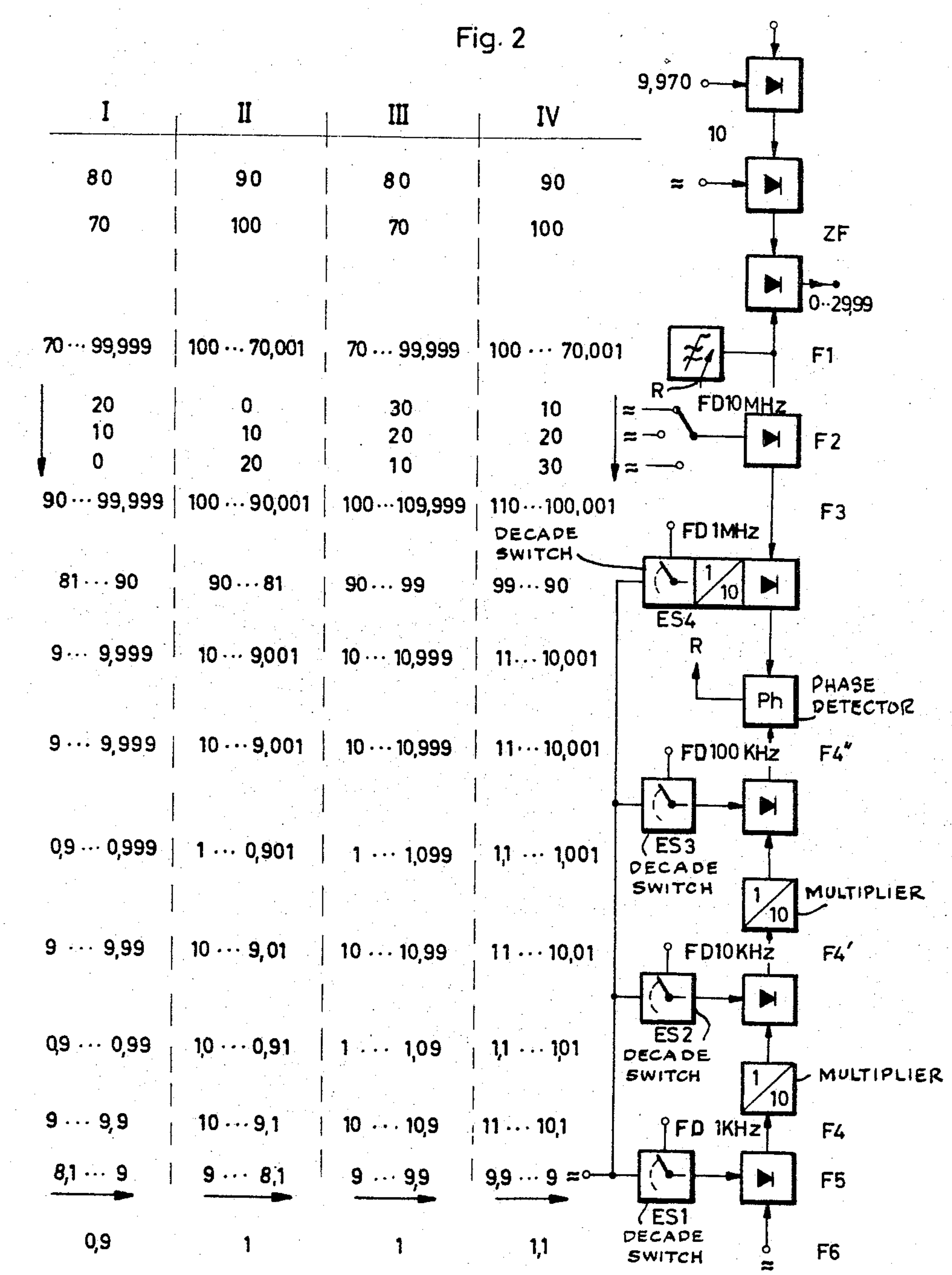
Figure 3:
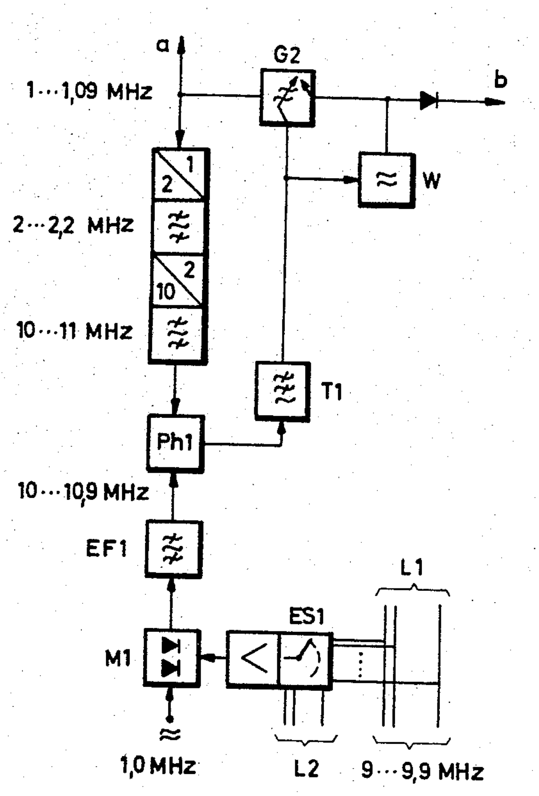

On basis of FIG. 2 there will be discussed four frequency programs I to IV, frequency programs I and II effecting the frequency build-up in the 10−1 megacycle range and frequency programs III and IV in the 10+1 megacycle range. The frequency values arranged one above the other in vertical columns in each of the four frequency programs are associated with the most important circuit stages indicated on the right hand side of FIG. 2 (taken from the corresponding block diagram of FIG. 1). The frequencies indicated in FIG. 1 correspond to frequency program III. The frequencies are in all figures indicated in magacycles. The arrows associated with the frequency ranges designated F2 and F5 (FIG. 2) indicate in what direction the transmitting frequencies are increasing. From FIG. 2 it can be noted that two different raster spectra (8.1 to 9 megacycles and 9 to 9.9 megacycles) are possible for F5. In the decade with the finest steps, the F5 frequencies are either modulated with the quartz-stabilized oscillation of the frequency $F6=0.9$, 1 or 1.1 megacycle, from which then after mixing in the first frequency decade the sum frequencies $F4=9$ . . . 9.9/10 . . . 9.1/10 . . . and 11 . . . 11.1 megacycles are produced. These four frequency ranges F4 all begin with ten times the F6 frequency so that the latter is produced again upon the following 10:1 frequency division. At the end of the build-up in the 100 kc. decade, there is obtained a comparison frequency F4″, the variation of which falls in a range which is equal to a frequency band of 1 megacycle less one step of the smallest decade provided.

Upon further consideration of the individual frequency programs, it is seen that in the case of frequency program I starting from the frequency $F6=0.9$ megacycle, the same frequency (9 megacycles) occurs as frequency F4 and frequency F5. As compared with the other three frequency programs, frequency program I has the disadvantage that secondary waves can still only be separated with great expenditure of filters. Frequency programs II and III have on the other hand the advantage over frequency program IV that the input oscillation $F6=1$ magacycle can be taken directly from the quartz generator G1 (frequency program IV $F6=1.1$ megacycles). Frequency programs II and III differ from each other also by the fact that the output frequency F1 of the adjustable oscillator makes an intermediate frequency of 100 magacycles (frequency program II or 70 megacycles (frequency program III) necessary. The adjustment of the 10 megacycle decades is more favorable in the case of frequency program II with the frequencies 0/10/20, than in the case of frequency program III with the frequencies 30/20/10 megacycles. Frequency program IV has the advantage over the other frequency programs that fewer demands need be made on the single sideband filter.

The frequency programs considered here therefore satisfy the condition that the frequency variation in the frequency decades does not exceed 10 percent.

The frequency build-up for the controlled transmitter shown in FIG. 1 will be explained briefly in its essential points on basis of frequency program III. The controlled transmitter is to be adjustable for instance in small frequency steps to frequencies between 0 and 30 megacycles. The circuit shown in FIG. 1 provides very small frequency steps of 1 kc. By the addition of further decades a corresponding reduction in the size of the steps is possible.

The frequency produced in a frequency-stabilized generator G1 is 1 megacycle in the case of the frequency program selected. The required harmonics spectrum with 100 kc. frequency basing is between 9 and 9.9 megacycles.

The building up of the signals is effected in a pre-convertor at 30 kc. From this frequency level, the signal is converted directly into the level of 10 magacycles and filtered out for instance by a quartz filter having a pass width of ±6 kc. For conversion into the 10 megacycle level there is used a carrier of 9.970 magacycles which is produced by modulation of the 30 kc. oscillation with the 10 megacycle oscillation. In this connection, the 30 kc. carrier need not be derived from a standard frequency since its frequency error drops out by the double modulation in the pre-convertor and here again. All other frequencies for the conversion are obtained by frequency multiplication of the oscillation S1. By means of a carrier frequency of 80 megacycles, the signal is thereupon raised to a frequency level of 70 megacycles. In the following mixer stage M the signal is converted by the oscillation of the fixed-frequency controlled adjustable oscillator G, which oscillates between 70 and 99.999 megacycles, directly into the transmitting-frequency level of 0 to 30 megacycles. The conversion of the signal into the radio frequency position is effected directly by the oscillator G with an oscillation frequency lying above the transmitting frequency. The converted signal can therefore be fed, avoiding tunable filters, via a low-pass filter T, by which the frequency range towards low frequencies is not limited, to a wideband amplifier BV. The frequency variation of the oscillator G is relatively small so that it can be electronically retuned.

The frequency build-up of the 10 megacycle and 1 megacycle decades is effected in accordance with the frequency-analysis method. The adjustable oscillator G can be switched in ranges of 10 megacycles. Accordingly the mixer stage of the 10 megacycle decade is offered a 10, 20 or 30 megacycle oscillation (F2). Via the single sideband filter of the 10 megacycle decade, the next following 1 megacycle decade is fed in oscillation (F3) within the range of 100 to 109.999 megacycles. The 1 megacycle decade consists of the decade switch for the 10 harmonics of 9 megacycles to 9.9 megacycles, a 1:10 multiplier stage, a mixer stage and a single sideband filter at the output of which there is obtained a frequency of 10 megacycles to 10.999 megacycles, which is compared in phase in the subsequent phase discriminator *Ph* with the comparison F4″ built up in the other frequency decades. A controlled voltage obtained in this connection is fed via the control line R to the oscillator G for the synchronization.

If frequency dividers are present in the frequency decades, then there is obtained the advantage for the design thereof when using one of the frequency programs I to IV that frequency-control frequency dividers without tuning can be used. On basis of the frequency decade for one kilocycle shown in FIG. 3, the frequency-divider circuit will be explained in detail. The essential circuit parts of the frequency decade are the electronically-operating decade switch ES1, the modulation stage M1, the single sideband filter EF1 and the frequency divider stage. Via the lines L1, which are connected with the ten harmonic filters F to F9 (FIG. 1), the harmonics are offered to the decade switch ES1 which is controlled via the lines L2. The oscillation adjusted by the electronic decade switch ES1 from one of the harmonic filters is so amplified that it can be used as carrier of the mixer stage M1. The amplifiers for the harmonics can be avoided if the harmonic filters are replaced by locked-in quartz oscillators. The oscillation coming from the preceding decade is fed to the second input of the modulator M1. In the present case of the smallest frequency decade used, the second modulator input is fed directly to the voltage produced in the frequency stabilized generator G1 with the input frequency $F6=1$ megacycle. In the modulation process, the formation of the 9th, 10th or 11th harmonic of the frequency fed to the modulator input must be avoided since these harmonics, as soon as they come near the useful oscillation, can no longer be separated from the latter. The sum frequency obtained at the output of the modulator M1 of the applied oscillations is filtered out by the single sideband filter EF1, on which only slight cut-out demands need be made. It is merely necessary that the amplitude of the desired oscillation be at least ten times greater than all other harmonics. The oscillation obtained is amplified and fed to a phase discriminator *Ph*1. The frequency division takes place in the manner that a frequency-controlled oscillator G2 oscillates with a tenth of the frequency of the voltage received at the single sideband filter. Its frequency is subsequently doubled and then quintupled in separate stages. The oscillation thus produced is fed to a second input of the phase discriminator *Ph*1. With the control voltage obtained from the phase comparison, the oscillator G2 the voltage of which is passed via the line *a* to the next following frequency stage, is controlled to a fixed frequency. It is avoided by 10 fold frequency multiplication in two stages that the generator G2 can be controlled to one-ninth of one-eleventh of the control frequency. The case that the generator G2 oscillates at one-eighths on one-twelfth of the control frequency, can definitely be avoided since in these cases the natural frequency of the oscillator would have to be more than 10 percent detuned.

The use of a controlled oscillator as frequency divider brings about certain very important advantages. When the secondary waves coming from the single sideband filter for 10 megacycles are a sufficiently great distance from the frequency of the useful signal, for instance 100 kc., they can easily be completely suppressed by the low-pass on which only slight cut-out demands need be made. It is merely necessary that the amplitude of the desired oscillation be at least ten times greater than all other harmonics. The oscillation obtained is amplified and fed to a phase discriminator *Ph*1. The frequency division takes place in the manner that a frequency-controlled oscillator G2 oscillates with a tenth of the frequency of the voltage received at the single sideband filter. Its frequency is subsequently doubled and then quintupled in separate stages. The oscillation thus produced is fed to a second input of the phase discriminator *Ph*. With the control voltage obtained from the phase comparison, the oscillator G2 the voltage of which is passed via the line *a* to the next following frequency stage, is controlled with fixed frequency. It is avoided by tenfold frequency multiplication in two stages that the generator G2 can be controlled to one-ninth or one-eleventh of the control frequency. The case that the generator G2 oscillates at one-eighth or one-twelfth of the control frequency, can definitely be avoided since in these cases the natural frequency of the oscillator would have to be more than 10 perecnt detuned.

The use of a controlled oscillator as frequency divider brings about certain very important advantages. When the secondary waves coming from the single sideband filter for 10 megacycles are a sufficiently great distance from the frequency of the useful signal, for instance 100 kc., they can easily be completely suppressed by the low-pass filter T arranged in the control line. In this way the generator G2 itself is free of secondary waves. Since no high amplifications are necessary, the phase-noise problem also affords no difficulties. As frequency lock-in circuit for the generator G2 there is used a wobble generator W lying outside the control path. In case of the presence of a frequency controlled voltage the wobble generator does not oscillate. Upon a change in frequency the generator oscillates for a short time (maximum 3 to 4 cycles) until the oscillator has locked in, whereupon the wobble generator is stopped. If the case occurs that the generator G2 cannot lock-in because for instance one of the oscillations has dropped out at the phase bridge *Ph*1, then the generator G2, caused by the continuing operation of the wobble generator W, produced a frequency-modulator oscillation which, if it were transmitted, would disturb other radio broadcasts in a larger or smaller frequency range.

In order to avoid this, the rectified wobble amplitudes are fed from the lock-in circuits of all frequency control oscillators via a line to the gate of a common relaxation stage which disconnects the operating voltage of the wide-band output amplifier BV. Simultaneously with the disconnecting of the transmitter, a noise signal is given off. By this simple monitoring device, the control transmitter is effectively protected. Similarly, the level of the different carrier generators is continuously monitored. The defective stage can easily be found by the criterion indicated.

Figure 4:
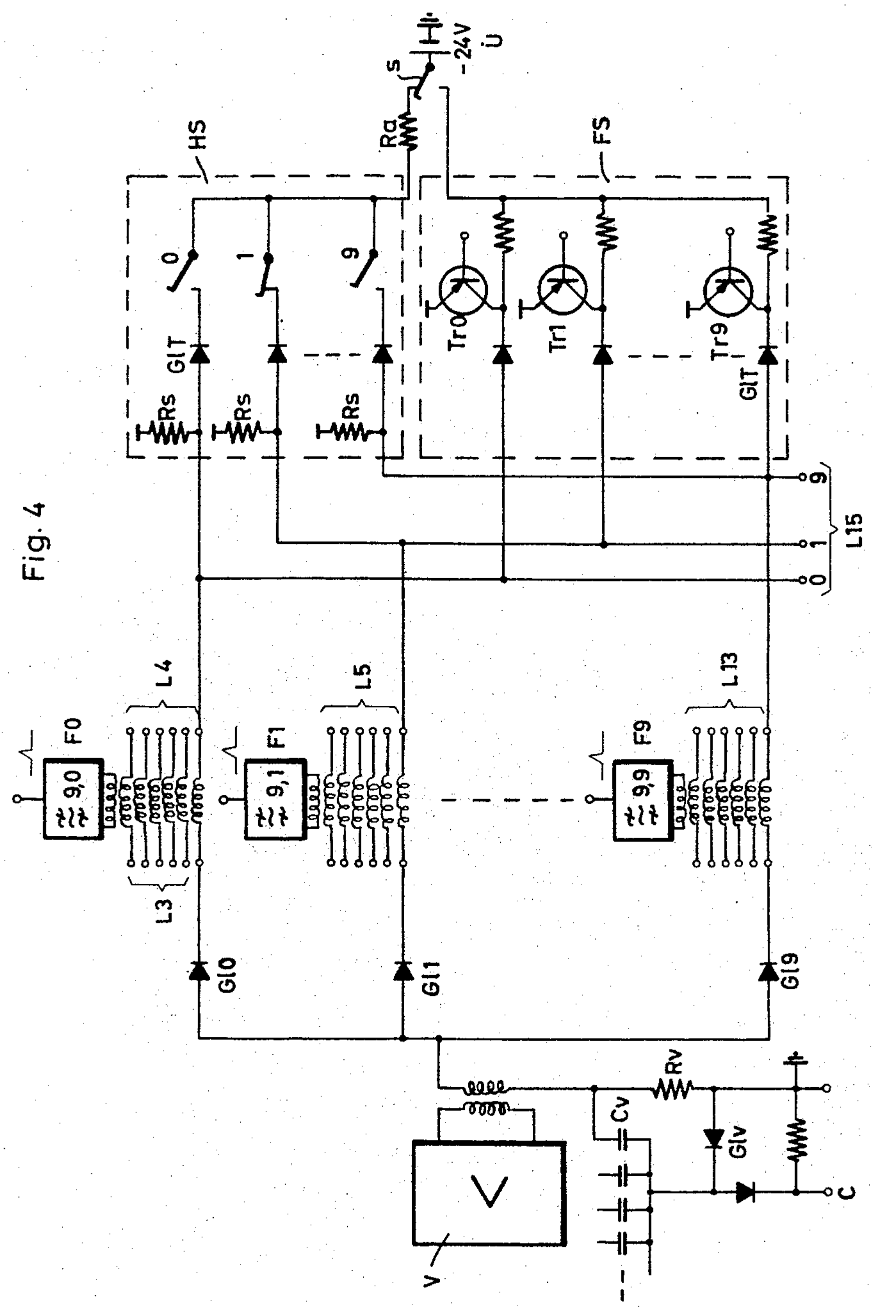

Another essential part of the circuit of the controlled transmitter, the decade switch, is shown with respect to the first frequency decade in FIG. 4. The decade circuit can be switched by hand to remote control by means of the switch S. The corresponding switch means for the manual control are designated HS, and those for remote control by FS. In FIG. 4, the harmonic filters F0 to F9 which are provided jointly, only one is indicated for all decades. Each of the 10 harmonic filters has an output transformer on the output side of which there are provided a number of parallel windings equal to the number of decade stages; of 10 cycle steps are planned in the smallest decade, there will therefore be six windings. The six output windings of each of the harmonic filters are designated L4 to L13. The coupling of the decade stages can be effected by RC-coupling, circumventing the parallel secondary windings of the transformer. In each of the decades of 10 cycles to 1 megacycle, it must be possible to set all digits from 0 to 9. Accordingly, the windings L4 of the harmonic filter F0 are associated with the digit 0, the windings L5 of the harmonic filter FL with the digit 1, etc. The manner of operation of the circuit will be explained with reference to the first decade. The non-connected windings, for instance L3 in the case of the harmonic filter F0, of all harmonic filters pass to the other decades (not shown) 2 to 6. In the embodiment taken by way of example, the switch S is switched to manual control and the switch 1, corresponding to the digit 1, is closed. In this condition, a current flows from the battery U with a voltage of for instance −24 v., via the switch rectifier G–11 which is connected in series with an output winding of the harmonic filter F1 and makes it permeable. In this way the harmonics of the frequency 9.1 megacycles of the harmonic filter F1 is transmitted to the amplifier V of the first decade. The control current of for instance a few milliamperes produces at the resistanec at the resistance Rv a voltage drop which may amount for instance to about 12 volts. By this voltage all other switch rectifiers G10, G12 to G19, which are in each case connected in series with an output winding of the other harmonic filters are blocked. The blocking current of these switch rectifiers discharges via the resistors Rs in the manual control HS. The inverse attenuation of these rectifiers is entirely sufficient for dependable operation.

The remote control device is indicated symbolically by the output transistors Tr0 to Tr9 and operates in such a manner that there is connected that output winding of one of the harmonic filters the associated transistor of which is blocked. In the device for the manual and the remote control there are provided cut-out rectifiers GIT, whereby both control devices can be connected simultaneously without interfering with each other, even if the individual switches are not disconnected. The report on the frequency adjusted is possible over the lines 15 in the manner that a controlled voltage of for instance −12 volts can be taken off from at the line associated with the digit set at the time. Both the manual and the remote, as well as the return report, are so combined outside the apparatus that in the apparatus itself only one line each per digit per decade need be introduced. The controlled commands must be given uncoded. The voltage source U (−24 volts) can also be connected directly in series with the resistor Rv on its grounded side. The switch S, then supplies the ground contact.

In case of frequency change on the control transmitter, it is necessary that for tuning the power stage a switch criterion for this command be given. Since the remote control for the controlled transmitter is a time multiplex process, there elapses between the two commands "old frequency off" and "new frequency on," at least the time of a telegraph step, that is, about 20 *ms.* During this time the voltage at the resistor Rv has either dropped to zero or has risen to a higher voltage, for instance 12 to 16 volts. This change in potential is fed via a capacitor Cv to the rectifier device G1v which, via the line *c* gives off a current pulse to a bistable relaxation circuit (not shown). The bistable relaxation circuit gives an indication that the controlled transmitter is to be modulated fully ("upper line"). The connecting back of the relaxation circuit is effected by a command from the power transmitter. Each frequency decade, the frequency steps of which are greater than 10 kc., is connected via a capacitor Cv of its own to the rectifier combination G1v. In case of smaller frequency steps, the controlled transmitter need not be switched to "upper line." For the correcapacitor Cv of its own to the rectifier combination G1v. is provided.

Changes may be made within the scope and spirit of the appended claims which define what is believed to be new and desired to have protected by Letters Patent.

I claim:

1. In a remotely controllable adjustable frequency transmitter, the combination of (A) a fixed frequency generator;

(B) a tunable oscillator having a frequency range above a transmitting frequency range;

(C) a mixing stage connected to said tunable oscillator and having an output from which the variable transmitting frequency is obtained;

(D) a plurality of permanently tuned filters;

(E) means connected between said generator and said filters for producing a frequency spectrum of harmonics of the output frequency of said generator;

(F) a plurality of frequency decades, each comprising (1) a modulator stage having a plurality of inputs and an output, (2) a single-sideband filter connected to an output of said modulator stage, and (3) a decade switch connected to one of said modulator inputs for selectively supplying frequencies thereto, certain ones of said decades being operatively connected in series as a group with said generator with the output of said permanently tuned filters being connected to said decade switches, at least one of the frequency decades of said group having in its output (a) a frequency divider comprising a divider oscillator whose output forms a divided frequency, whereby individual harmonics of said generator may be selectively obtained as a stabilized comparison frequency from an output of said series of said decades, and (b) means for rigidly controlling the frequency of said divider oscillator, another of said decades being operatively connected to said tunable oscillator and operative to convert the output frequency thereof to a converted frequency corresponding to said comparison frequency, the maximal frequency change occurring at the modulator output of each frequency decade stage amounting to not more than 10% of the converted frequency; and (G) a phase comparison circuit to which are supplied said stabilized comparison frequency and said converted frequency derived from said tunable oscillator, the output of said phase comparison circuit, representing a regulating voltage, being conducted to said tunable oscillator for the rigid frequency control thereof, without gaps, over the operative range thereof representative of said transmitting range.

2. A remotely controllable transmitter according to claim 1, comprising in further combination a bistable flip-flop circuit common to all corresponding circuits of the respective frequency decades, a frequency locking means operatively connected to said divider oscillator and including a wobble generator, a rectifier, the output voltage of said wobble generator being connected through said rectifier to said flip-flop circuit, an amplifier operatively connected to the output of said mixing stage for the transmitter frequency, and means controlled by said flip-flop circuit for rendering said amplifier inoperative in the absence of locking in of the divider oscillator.

3. A remotely controllable transmitter according to claim 2, comprising in further combination, a gate circuit for monitoring the voltage of the fixed frequency generator and that of the harmonic voltages derived from the frequency of said generator in the bistable flip-flop circuit.

4. A remotely controllable transmitter according to claim 1, wherein said tunable oscillator is constructed for operation in a plurality of frequency ranges, and electronic means for switching the oscillator from one to another of such ranges.

5. A remotely controllable transmitter according to claim 1, wherein the tuned filters comprise quartz oscillators locked to their operative frequency.

6. A remotely controllable transmitter according to claim 1, further comprising a control device for controlling the frequency output of the frequency decades and, wherein said decade switches comprise remotely controllable switching rectifiers forming a part of said control device.

(References on following page)

References Cited

UNITED STATES PATENTS

| | | | |
|---|---|---|---|
| 2,752,497 | 6/1956 | Ensink | 331—25 |
| 2,756,331 | 7/1956 | Foster et al. | 331—40 X |
| 2,810,832 | 10/1957 | Broadhead | 331—31 X |
| 2,829,255 | 4/1958 | Bolie | 331—40 |
| 2,957,144 | 10/1960 | Huhn | 331—51 X |
| 3,020,421 | 2/1962 | Criaglow | 307—88.5 |
| 3,177,444 | 4/1965 | Foot | 331—22 |
| 3,227,963 | 1/1966 | Dimmick | 331—40 |
| 3,235,815 | 2/1966 | Kiecher | 331—39 |

JOHN W. CALDWELL, *Acting Primary Examiner.*

B. V. SAFOUREK, *Assistant Examiner.*